United States Patent
Canelhas

(10) Patent No.: US 11,237,199 B2
(45) Date of Patent: Feb. 1, 2022

(54) ELECTRICAL ASSEMBLY FOR DETECTING DIELECTRIC BREAKDOWN IN DIRECT CURRENT POWER TRANSMISSION MEDIUM

(71) Applicant: GENERAL ELECTRIC TECHNOLOGY GMBH, Baden (CH)

(72) Inventor: Andre Canelhas, Staffordshire (GB)

(73) Assignee: General Electric Technology GmbH, Baden (CH)

( * ) Notice: Subject to any disclaimer, the term of this patent is extended or adjusted under 35 U.S.C. 154(b) by 222 days.

(21) Appl. No.: 16/614,212

(22) PCT Filed: Apr. 26, 2018

(86) PCT No.: PCT/EP2018/060660
§ 371 (c)(1),
(2) Date: Nov. 15, 2019

(87) PCT Pub. No.: WO2018/210543
PCT Pub. Date: Nov. 22, 2018

(65) Prior Publication Data
US 2021/0333315 A1    Oct. 28, 2021

(30) Foreign Application Priority Data
May 17, 2017 (GB) ..................... 1707908

(51) Int. Cl.
*G01R 31/08* (2020.01)
*G01R 31/12* (2020.01)
*G01R 31/14* (2006.01)

(52) U.S. Cl.
CPC ....... *G01R 31/085* (2013.01); *G01R 31/1272* (2013.01); *G01R 31/14* (2013.01)

(58) Field of Classification Search
CPC .. G01R 31/085; G01R 31/52; G01R 31/1272; G01R 31/02; G01R 31/021; G01R 31/28;
(Continued)

(56) References Cited

U.S. PATENT DOCUMENTS

| 10,310,462 B2* | 6/2019 | Kumar Beeram ... G01K 15/007 |
| 2004/0036478 A1* | 2/2004 | Logvinov ................ H04B 3/54 324/534 |

(Continued)

FOREIGN PATENT DOCUMENTS

| WO | 2005/038477 A1 | 4/2005 |
| WO | 2012/159652 A1 | 11/2012 |

OTHER PUBLICATIONS

International Search Report of PCT/EP2018/060660 dated Jul. 26, 2018.
(Continued)

*Primary Examiner* — Thang X Le
(74) *Attorney, Agent, or Firm* — Eversheds Sutherland (US) LLP

(57) ABSTRACT

In the field of power transmission networks, particularly high voltage direct current (HVDC) power transmission networks, there is provided an electrical assembly (10). The electrical assembly (10) comprises a converter (12) that includes at least one AC terminal (14A, 14B, 14C) for connection to an AC network (16) and at least one DC terminal (18, 22) which is operatively connected to a DC power transmission medium (20, 24). The electrical assembly (10) also includes a signal injection circuit (32) which is operatively coupled with at least one DC power transmission medium (20, 24). The signal injection circuit (32) includes a signal generator (38) to selectively inject a plurality of different frequency signals into the said at least one transmission medium (20, 24). In addition the signal injection circuit (32) includes a signal analyser (42) to establish a
(Continued)

response signature of the said at least one transmission medium (20, 24) to the plurality of different frequency injected signals. The signal injection circuit (32) also includes a control unit (46) that is programmed to detect a dielectric breakdown in the said at least one transmission medium (20, 24). More particularly the control unit (46) is programmed to control the signal generator (38) to inject a plurality of different frequency signals into the said transmission medium (20, 24), retrieve the corresponding response signature of the said transmission medium (20, 24) from the signal analyser (42), and compare the response signature to a plurality of reference signatures corresponding to dielectric breakdown and non-breakdown conditions in the said transmission medium (20, 24).

15 Claims, 1 Drawing Sheet

(58) Field of Classification Search
CPC .............. G01R 31/024; G01R 31/2884; G01R 31/2886; G01R 31/2896; G01R 31/2851; G01R 31/2801; G01R 31/14; G01R 31/16; G01R 31/1218; G01R 31/129; G01R 31/1254; G01R 31/2642; G01R 31/022; G01R 31/025
See application file for complete search history.

(56) References Cited

U.S. PATENT DOCUMENTS

| | | | | |
|---|---|---|---|---|
| 2011/0210750 A1* | 9/2011 | Medelius | ................. | H01B 1/24 |
| | | | | 324/543 |
| 2013/0268216 A1* | 10/2013 | Dalban Pilon | ........... | H02H 3/17 |
| | | | | 702/58 |
| 2014/0062500 A1* | 3/2014 | Behrends | ................ | H02S 50/10 |
| | | | | 324/537 |
| 2019/0107573 A1* | 4/2019 | Ben Hassen | ........... | G01R 31/11 |

OTHER PUBLICATIONS

European Search Report for Application No. 1707908.8 dated Sep. 21, 2017.

* cited by examiner

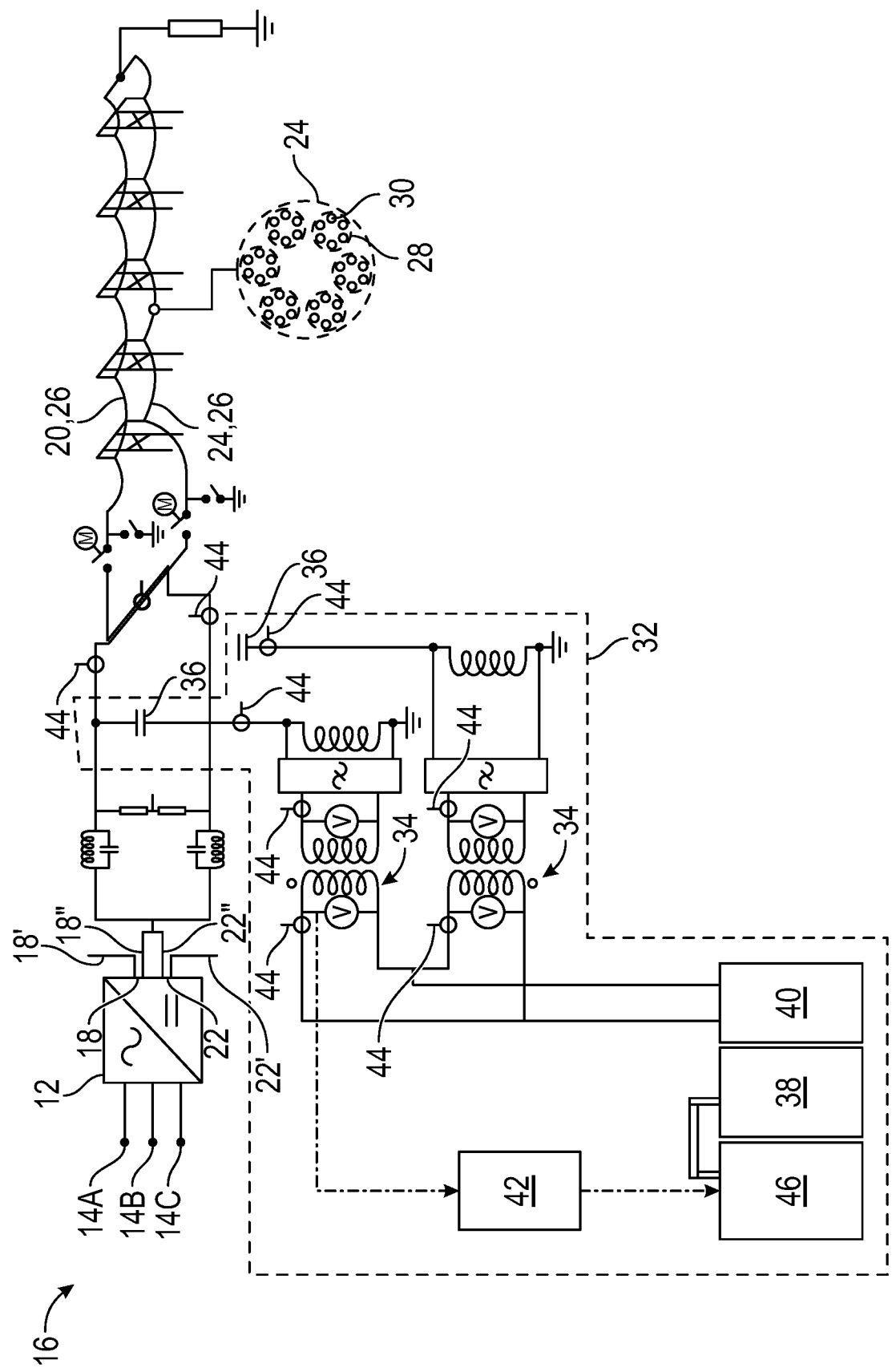

ELECTRICAL ASSEMBLY FOR DETECTING DIELECTRIC BREAKDOWN IN DIRECT CURRENT POWER TRANSMISSION MEDIUM

CROSS-REFERENCE TO RELATED APPLICATIONS

This application is a U.S. National Stage Application under 35 U.S.C. 371 and claims the priority benefit of International Application No. PCT/EP2018/060660 filed Apr. 26, 2018, which claims priority to GB1707908.8, filed May 17, 2017, which are both incorporated herein by reference.

This invention relates to an electrical assembly for use in a power transmission network.

In power transmission networks, particularly high voltage direct current (HVDC) power transmission networks, alternating current (AC) power is typically converted to direct current (DC) power for transmission via one or more DC power transmission mediums such as overhead lines, undersea cables and/or underground cables. This conversion removes the need to compensate for the AC capacitive load effects imposed by the power transmission medium, i.e. the transmission line or cable, and reduces the cost per kilometre of the lines and/or cables, and thus becomes cost-effective when power needs to be transmitted over a long distance.

Such lines and cables are susceptible however to dielectric breakdowns, i.e. a reduction in the resistance of electrical insulation within the power transmission medium which impairs its ability to sustain a required voltage.

A permanent dielectric breakdown may be caused by a sudden mechanical failure of structures which support an overhead line, such as cross arms, insulators, conductors, space dampers, or other fittings. Corrosion of grounding facilities of support towers for such lines might also cause a permanent dielectric breakdown, as may vandalism including theft of material or small arms fire at insulators.

Power transmission mediums might also suffer a temporary dielectric breakdown if too high a voltage is applied to a point on the transmission medium, e.g. because of a sudden switching operation, a lightning strike, or an induced overvoltage from another energized structure or transmission medium operating at a higher voltage than the transmission medium in question.

According to an aspect of the invention there is provided an electrical assembly, for use in a power transmission network, comprising a converter including at least one AC terminal for connection to an AC network and at least one DC terminal operatively connected to a DC power transmission medium, and a signal injection circuit operatively coupled with at least one DC power transmission medium, the signal injection circuit including:

a signal generator to selectively inject a plurality of different frequency signals into the said at least one transmission medium;

a signal analyser to establish a response signature of the said at least one transmission medium to the plurality of different frequency injected signals; and a control unit programmed to detect a dielectric breakdown in the said at least one transmission medium by controlling the signal generator to inject a plurality of different frequency signals into the said transmission medium, retrieving the corresponding response signature of the said transmission medium from the signal analyser, and comparing the response signature to a plurality of reference signatures corresponding to dielectric breakdown and non-breakdown conditions in the said transmission medium.

The ability to detect a dielectric breakdown in a power transmission medium is advantageous since it allows, as necessary, existence of the breakdown to be accommodated within operation of the electrical assembly or remedial action such as isolation and/or repair of the transmission medium to be carried out.

Moreover, the comparison of a corresponding response signature with a plurality of reference signatures is readily able to detect such dielectric breakdowns even in complex power transmission medium configurations, such as those including a dedicated metallic return (DMR) conductor rather than a more conventional ground return path.

Preferably the control unit is additionally programmed to determine when the dielectric breakdown is permanent.

Such a control unit desirably permits the necessary repair work to be initiated with respect to the damaged transmission medium.

When the dielectric breakdown is determined to be permanent, the control unit may be further programmed to establish the location of the dielectric breakdown by comparing the response signature to a plurality of reference signatures corresponding to dielectric breakdowns at different positions along the said transmission medium.

Establishing the location of a dielectric breakdown is particularly beneficial since it allows a maintenance crew to be deployed as soon as possible to the correct position along the transmission medium and for a safety perimeter to be similarly established quickly in the correct location.

In a preferred embodiment of the invention the reference signatures are established by staging dielectric breakdowns during one or both of:

simulation of the electrical assembly; and on-site calibration of the electrical assembly.

Establishing the reference signatures in the foregoing manner provides flexibility in terms of installing a control unit that is immediately able reliably and accurately to detect the presence of dielectric breakdowns in a transmission medium during operation of an electrical assembly.

Optionally the control unit is still further programed to update one or more reference signatures on the basis of a response signature established by the signal analyser.

Such a feature helps to increase the likelihood and associated accuracy of detecting a future dielectric breakdown.

In another preferred embodiment of the invention the control unit is also programmed to continuously review the reference signatures each time a new response signature is established by the signal analyser.

Having a control unit so programmed allows it to accumulate knowledge and learn from past experiences, so as to detect dielectric breakdowns, and in particular their location, with ever increasing accuracy.

Preferably the said at least one transmission medium includes at least one conductor member.

At least one conductor member may include at least one conductor sub-member.

The foregoing features provide flexibility in terms of the makeup and configuration of the or each power transmission medium.

In a further preferred embodiment of the invention the signal generator is configured to selectively inject a plurality of different frequency signals into the or each conductor member.

Configuring the signal generator in such a manner permits testing of the integrity of individual conductor members, i.e. testing whether an individual conductor member has suffered a dielectric breakdown, and hence allows for a determination of the dielectric strength, i.e. the ability to sustain a given voltage differential, of the transmission medium as a whole.

The signal generator may include a plurality of individual power supplies.

The inclusion of a plurality of individual power supplies within the signal generator permits each such power supply to be deployed to power the injection of different frequency signals into a particular, individual conductor member.

Preferably each injected signal is a current waveform.

The injection of such current waveforms permits the establishment of a response signature for the or each transmission medium which is capable of distinguishing between dielectric breakdown and non-breakdown conditions in the given transmission medium.

In a still further preferred embodiment of the invention the signal analyser includes a plurality of measuring devices to provide measured samples of the injected signals.

Optionally the measuring devices include current and voltage measuring devices.

The plurality of measuring devices may be installed:
on the said at least one transmission medium; and/or
in the signal injection circuit.

In an electrical assembly in which the plurality of measuring devices are at least installed on the said at least one transmission medium, preferably:
a respective measuring device is installed on the or each conductor member in the transmission medium; and/or
the measuring devices are installed at different locations along the length of the transmission medium.

The inclusion of various measuring devices within the signal analyser desirably allows it to establish a response signature of the said at least one transmission medium with sufficient resolution and characteristics to permit the detection of a dielectric breakdown therein.

There now follows a brief description of preferred embodiments of the invention, by way of non-limiting examples, with reference being made to FIG. 1 which shows a schematic view of an electrical assembly according to a first embodiment of the invention.

An electrical assembly according to a first embodiment of the invention is designated generally by reference numeral 10, as shown in FIG. 1.

The electrical assembly 10 includes a converter 12 which, in the embodiment shown includes first, second and third AC terminals 14A, 14B, 14C, each of which corresponds to a respective phase A, B, C of an associated three-phase AC network 16 with which the converter 12 is in use connected. The converter 12 also includes a first DC terminal 18 which has a first connection member 18', e.g. a first busbar, via which the first DC terminal 18 is connectable in use to an electrical device such as another converter, and a second connection member 18", e.g. a second busbar, via which the first DC terminal 18 is operatively connected to a first DC power transmission medium 20. The converter 12 still further includes a second DC terminal 22 which has a third connection member 22', e.g. a third busbar, via which the second DC terminal 22 is connectable in use to another electrical device such as a still further converter, and a fourth connection member 22", e.g. a fourth busbar, via which the second DC terminal 22 is operatively connected to a second DC power transmission medium 24, which together with the first DC power transmission medium 20 defines a transmission line. Other converter arrangements are however possible including, for example, fewer than or more than three AC terminals and/or fewer than or more than two DC terminals with similarly differing numbers of connection members.

Each power transmission medium 20, 24 takes the form of an overhead line 26 which is made up of six separate conductor members 28, i.e. six individual conductor cables, which themselves is each defined by a bundle of five conductor sub-members 30, i.e. a bundle of five individual conductor wires. In other embodiments of the invention, however, one or more of the power transmission mediums may take a different form, such that they include fewer than or more than six conductor members or indeed only a single conductor member, and/or they include one or more conductor members that have fewer than or more than five conductor sub-members or one or more solid conductor members that are not formed from a bundle of conductor sub-members.

The electrical assembly 10 also includes a signal injection circuit 32 which is operatively coupled with each of the first and second transmission mediums 20, 24, and more particularly, is operatively coupled with the first and second transmission mediums 20, 24 via a respective, series-connected, coupling transformer 34 and coupling capacitor 36.

The signal injection circuit 32 includes a signal generator 38 that is configured to selectively inject a plurality of different frequency signals into each of the first and second transmission mediums 20, 24, and more particularly inject a plurality of different frequency signals into each separate conductor member 28, i.e. each separate conductor cable, within the transmission mediums 20, 24.

The signal generator 38 includes a plurality of individual power supplies 40 (only one of which is shown). The power supplies may operate in parallel to provide an increased level of power or individually, e.g. so as to separately provide power to inject a plurality of different frequency signals into a given conductor member 28. The signal generator 38 also includes a reference signal source (not shown) for use in creating the signals to be injected, although this need not necessarily be included.

Each injected signal is a current waveform, and preferably is a positive sequence current waveform.

The signal injection circuit 32 also includes a signal analyser 42 to establish a corresponding response signature of each transmission medium 20, 24 to the plurality of different frequency signals that are injected thereinto.

The signal analyser 42 includes a plurality of current and voltage measuring devices 44 to provide measured samples of the injected signals. The measuring devices 44 are installed both on the first and second transmission mediums 20, 24 and in the signal injection circuit 32.

Those measuring devices 44 that are installed on the first and second transmission mediums 20, 24 include respective measuring devices that are installed on each of the six conductor members 28 within each said transmission medium 20, 24.

In addition to the foregoing, the signal injection circuit 32 further includes a control unit 46 that is programmed to detect a dielectric breakdown in each of the first and second transmission mediums 20, 24. In other embodiments of the invention the signal injection circuit may instead be programmed to detect a dielectric breakdown in one or other of the first and second transmission mediums, or indeed in only one, fewer than all, or all of the transmission mediums in an electrical assembly having more than two transmission mediums. It may also be programmed simply to detect a dielectric breakdown in a single transmission medium within an electrical assembly having only one such transmission medium.

In any event, the control unit 46 is programmed to detect a dielectric breakdown by first controlling the signal generator to inject a plurality of different frequency signals, i.e. a plurality of different frequency positive sequence current waveforms, into each of the first and second transmission mediums 20, 24, and more particularly into each of the six conductor members 28 within each of the first and second transmission mediums 20, 24.

The control unit 46 is programmed to then retrieve the corresponding response signature of each of the first and second transmission mediums 20, 24 from the signal analyser 42, and to compare each retrieved response signature to a plurality of reference signatures corresponding to dielectric breakdown and non-breakdown conditions in each said transmission medium 20, 24.

In addition, the control unit 46 is programmed to determine when the dielectric breakdown is permanent, e.g. by monitoring the duration over which the breakdown persists, and in instances when the dielectric breakdown is determined to be permanent, is further programmed to establish the location of the dielectric breakdown by comparing each response signature to a plurality of reference signatures corresponding to dielectric breakdowns at different positions along the corresponding transmission medium 20, 24 of interest.

In the embodiment shown, the reference signatures are established by staging dielectric breakdowns during both simulation of the electrical assembly 10, e.g. via computer modelling, and on-site calibration of the electrical assembly 10, e.g. during initial commissioning of the electrical assembly 10. In other embodiments however, the reference signatures may instead be established by staging dielectric breakdowns during one or other of simulation or on-site calibration of the electrical assembly.

The control unit 46 is still further programmed to update one or more reference signatures, as appropriate and necessary, on the basis of a new response signature established by the signal analyser 42. Moreover, the control unit 46 is also programmed to continuously review the reference signatures, and modify where appropriate, each time a new response signature is established by the signal analyser 42.

The invention claimed is:

1. An electrical assembly, for use in a power transmission network, comprising a converter including at least one AC terminal for connection to an AC network and at least one DC terminal operatively connected to a DC power transmission medium, and a signal injection circuit operatively coupled with at least one DC power transmission medium, the signal injection circuit comprising:
   a signal generator to selectively inject a plurality of different frequency signals into the at least one transmission medium;
   a signal analyser to establish a response signature of the at least one transmission medium to the plurality of different frequency injected signals; and
   a control unit programmed to detect a dielectric breakdown in the at least one transmission medium by controlling the signal generator to inject the plurality of different frequency signals into the transmission medium, retrieving the corresponding response signature of the transmission medium from the signal analyser, and comparing the response signature to a plurality of reference signatures corresponding to dielectric breakdown and non-breakdown conditions in the transmission medium;
   wherein the control unit is additionally programmed to determine when the dielectric breakdown is permanent, and
   wherein when the dielectric breakdown is determined to be permanent, the control unit is further programmed to establish the location of the dielectric breakdown by comparing the response signature to a plurality of reference signatures corresponding to dielectric breakdowns at different positions along the transmission medium.

2. The electrical assembly according to claim 1, wherein the control unit is additionally programmed to determine when the dielectric breakdown is permanent.

3. The electrical assembly according to claim 2, wherein when the dielectric breakdown is determined to be permanent, the control unit is further programmed to establish the location of the dielectric breakdown by comparing the response signature to a plurality of reference signatures corresponding to dielectric breakdowns at different positions along the transmission medium.

4. The electrical assembly according to claim 1, wherein the reference signatures are established by staging dielectric breakdowns during one or both of:
   simulation of the electrical assembly; and
   on-site calibration of the electrical assembly.

5. The electrical assembly according to claim 1, wherein the control unit is still further programed to update one or more reference signatures on the basis of a response signature established by the signal analyser.

6. The electrical assembly according to claim 5, wherein the control unit is also programmed to continuously review the reference signatures each time a new response signature is established by the signal analyser.

7. The electrical assembly according to claim 1, wherein the at least one transmission medium includes at least one conductor member.

8. The electrical assembly according to claim 7, wherein at least one conductor member includes at least one conductor sub-member.

9. The electrical assembly according to claim 7, wherein the signal generator is configured to selectively inject a plurality of different frequency signals into the or each conductor member.

10. The electrical assembly according to claim 9, wherein the signal generator includes a plurality of individual power supplies.

11. The electrical assembly according to claim 1, wherein each injected signal is a current waveform.

12. The electrical assembly according to claim 1, wherein the signal analyser includes a plurality of measuring devices to provide measured samples of the injected signals.

13. The electrical assembly according to claim 12, wherein the measuring devices include current and voltage measuring devices.

14. The electrical assembly according to claim 12, wherein the plurality of measuring devices are installed:
   on the said at least one transmission medium; and/or
   in the signal injection circuit.

15. The electrical assembly according to claim 14, in which the plurality of measuring devices are at least installed on the at least one transmission medium, wherein:
   a respective measuring device is installed adjacent the or each conductor member in the transmission medium; and/or the measuring devices are installed at different locations along the length of the transmission medium.

\* \* \* \* \*